(12) United States Patent
Ausschnitt et al.

(10) Patent No.: US 7,879,515 B2
(45) Date of Patent: Feb. 1, 2011

(54) METHOD TO CONTROL SEMICONDUCTOR DEVICE OVERLAY USING POST ETCH IMAGE METROLOGY

(75) Inventors: Christopher P. Ausschnitt, Boston, MA (US); William A. Muth, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 12/017,134

(22) Filed: Jan. 21, 2008

(65) Prior Publication Data
US 2009/0186286 A1    Jul. 23, 2009

(51) Int. Cl.
*G03F 9/00* (2006.01)
*G03C 5/00* (2006.01)

(52) U.S. Cl. .......................... 430/22; 430/30; 257/797; 356/401; 438/975

(58) Field of Classification Search .................. 430/22, 430/30; 257/797; 356/401; 438/975
See application file for complete search history.

(56) References Cited

U.S. PATENT DOCUMENTS

| | | | |
|---|---|---|---|
| 4,166,219 A | 8/1979 | Ausschnitt et al. | |
| 4,290,384 A | 9/1981 | Ausschnitt et al. | |
| 4,437,760 A | 3/1984 | Ausschnitt | |
| 4,538,105 A | 8/1985 | Ausschnitt | |
| 4,568,189 A | 2/1986 | Bass et al. | |
| 4,848,911 A | 7/1989 | Uchida et al. | |
| 4,890,239 A | 12/1989 | Ausschnitt et al. | |
| 5,300,786 A | 4/1994 | Brunner et al. | |
| 5,343,292 A | 8/1994 | Brueck et al. | |
| 5,545,593 A | 8/1996 | Watkins et al. | |
| 5,629,772 A | 5/1997 | Ausschnitt | |
| 5,712,707 A | 1/1998 | Ausschnitt | |
| 5,756,242 A | 5/1998 | Koizumi et al. | |
| 5,757,507 A | 5/1998 | Ausschnitt et al. | |
| 5,776,645 A | 7/1998 | Barr et al. | |
| 5,790,254 A | 8/1998 | Ausschnitt | |
| 5,805,290 A | 9/1998 | Ausschnitt et al. | |
| 5,877,861 A | 3/1999 | Ausschnitt et al. | |
| 5,914,784 A | 6/1999 | Ausschnitt et al. | |
| 5,928,822 A | 7/1999 | Rhyu | |
| 5,949,547 A | 9/1999 | Tseng et al. | |
| 5,952,134 A | 9/1999 | Hwang | |
| 5,953,128 A | 9/1999 | Ausschnitt et al. | |
| 5,965,309 A | 10/1999 | Ausschnitt et al. | |
| 5,968,693 A | 10/1999 | Adams | |
| 5,976,740 A | 11/1999 | Ausschnitt et al. | |
| 5,981,119 A | 11/1999 | Adams | |
| 5,985,495 A | 11/1999 | Okumura et al. | |
| 6,003,223 A | 12/1999 | Hagen et al. | |
| 6,004,706 A | 12/1999 | Ausschnitt et al. | |
| 6,020,966 A | 2/2000 | Ausschnitt et al. | |
| 6,027,842 A | 2/2000 | Ausschnitt et al. | |
| 6,042,976 A | 3/2000 | Chiang et al. | |
| 6,061,119 A | 5/2000 | Ota | |
| 6,128,089 A | 10/2000 | Ausschnitt et al. | |
| 6,130,750 A | 10/2000 | Ausschnitt et al. | |
| 6,137,578 A | 10/2000 | Ausschnitt | |
| 6,183,919 B1 | 2/2001 | Ausschnitt et al. | |
| 6,317,211 B1 | 11/2001 | Ausschnitt et al. | |
| 6,335,151 B1 | 1/2002 | Ausschnitt et al. | |
| 6,346,979 B1 | 2/2002 | Ausschnitt et al. | |
| 6,350,548 B1 | 2/2002 | Leidy et al. | |
| 6,417,929 B1 | 7/2002 | Ausschnitt et al. | |
| 6,429,667 B1 | 8/2002 | Ausschnitt et al. | |
| 6,457,169 B1 | 9/2002 | Ross | |
| 6,460,265 B2 | 10/2002 | Pogge et al. | |
| 6,612,159 B1 | 9/2003 | Knutrud | |
| 6,638,671 B2 | 10/2003 | Ausschnitt | |
| 6,766,211 B1 | 7/2004 | Ausschnitt | |
| 6,803,995 B2 | 10/2004 | Ausschnitt | |
| 6,842,237 B2 | 1/2005 | Ausschnitt et al. | |

(Continued)

FOREIGN PATENT DOCUMENTS

JP    61-168227    7/1986

(Continued)

OTHER PUBLICATIONS

Starikov, Alexander; "Exposure Monitor Structure" Integrated Circuit Metrology, Inspection and Process Control IV, 1990, pp. 315-324.

(Continued)

*Primary Examiner*—Christopher G Young
(74) *Attorney, Agent, or Firm*—DeLio & Peterson, LLC; Peter W. Peterson; Wenjie Li

(57) ABSTRACT

A method of determining positioning error between lithographically produced integrated circuit patterns on at least two different lithographic levels of a semiconductor wafer comprising. The method includes exposing, developing and etching one or more lithographic levels to create one or more groups of marks comprising a target at one or more wafer locations. The method then includes exposing and developing a subsequent group of marks within the target on a subsequent lithographic level. The method then comprises measuring the position of the marks on each level with respect to a common reference point, and using the measured positions of the groups of marks to determine the relative positioning error between one or more pairs of the developed and etched lithographic levels on which the marks are located.

20 Claims, 5 Drawing Sheets

U.S. PATENT DOCUMENTS

| | | | |
|---|---|---|---|
| 6,869,739 | B1 | 3/2005 | Ausschnitt et al. |
| 6,879,400 | B2 | 4/2005 | Ausschnitt et al. |
| 6,937,337 | B2 | 8/2005 | Ausschnitt et al. |
| 6,975,398 | B2 | 12/2005 | Ausschnitt et al. |
| 7,042,551 | B2 | 5/2006 | Ausschnitt |
| 2001/0001900 | A1 | 5/2001 | Pogge et al. |
| 2002/0097399 | A1 | 7/2002 | Ausschnitt et al. |
| 2003/0053057 | A1 | 3/2003 | Mishima |
| 2007/0058169 | A1 | 3/2007 | Ausschnitt et al. |

FOREIGN PATENT DOCUMENTS

| | | |
|---|---|---|
| JP | 61-170032 | 7/1986 |
| JP | 2-260441 | 10/1990 |
| JP | 10-213895 | 8/1998 |
| WO | WO02/19415 | 3/2007 |

OTHER PUBLICATIONS

"Method for Measuring Semiconductor Lithographic Tool Focus and Exposure", IBM Technical Disclosure Bulletin, Jul. 1987, 2 pages.

Ausschnitt, Christopher P., Cheng, Shaunee Y.; "Modeling for Profile-Based Process-Window Metrology", SPIE5378-5, Feb. 26, 2004, pp. 1-6.

Binns, L.A. et al., Nanometrics; Ausschnitt, C.P., et al. IBM SDRC; "Overlay Metrology Tool Calibration", Proc. SPIE 6518 (2007), 8 pages.

Raugh, Michael R., "Self-calibration of Interferometer Stages: Mathematical Techniques for Deriving Lattice Algorithms for Nanotechnology"; Mar. 2002 (rev. Aug. 2003), 66 pages.

Binns, L.A. et al.; "Overlay Metrology Tool Calibration" "The Blossom calibration target", SPIE Advanced Lithography 6518-17, Feb. 27, 2007, 19 pages.

METHOD TO CONTROL SEMICONDUCTOR DEVICE OVERLAY USING POST ETCH IMAGE METROLOGY

BACKGROUND OF THE INVENTION

1. Field of the Invention

The present invention relates to the manufacture of integrated circuits and, in particular, to a method and system for determining overlay error in lithographic processing of integrated circuits.

2. Description of Related Art

Semiconductor manufacturing requires the sequential patterning of process layers on a single semiconductor wafer. Lithographic exposure tools known as steppers or scanners print multiple integrated circuit patterns or fields by lithographic methods on successive layers of the wafer. These exposure tools typically pattern different layers by applying step and repeat lithographic exposure or step and scan lithographic exposure in which the full area of the wafer is patterned by sequential exposure of the stepper fields containing one or more integrated circuits. Typically, 20-50 layers are required to create an integrated circuit.

In order to match corresponding features in successive lithographic process layers on the semiconductor wafer, it is important to keep overlay error as small as possible and within predetermined limits. Measurements are typically performed using metrology imaging tools, such as optical, scanning e-beam or atomic force microscopy systems. Prior art calibration artifacts and methods include box-in-box (BiB) or one dimensional (1-D) grating overlay patterns.

U.S. application Ser. Nos. 11/162,506 and 11/833,304, the disclosures of which are hereby incorporated by reference, disclose improved methods and target systems for determining overlay or alignment error between different fields in the same lithographic level or among the many lithographic levels required to create an integrated circuit. The multi-layer overlay target disclosed therein achieves comparable or superior metrology performance to box-in-box or grating structures, at substantial reduction of metrology target real estate.

Semiconductor overlay is routinely controlled using post lithography optical metrology, i.e., after development of the resist layer on which the images are projected. The overlay errors are collected from the metrology imaging tool and input into an automated process control (APC) application that models the linear error terms and feeds back optimized settings for lot-to-lot control. This control method provides fast feedback response since the lot is measured immediately after the imaging step.

FIG. 1 illustrates a prior art method of post-develop overlay metrology. Layer M of the current wafer lot L is deposited 120 over the previously etched and completed lithographic process layer M−1. At this $M^{th}$ process level, the mask and projected image are aligned 122 over the layer to be etched. The image of the $M^{th}$ layer is then exposed and developed 124 on a resist layer over layer M, and the exposure and development alignment settings A are stored in control database 134. To monitor overlay quality and feed back corrections to the alignment settings of the current lot L, the corrections are based on the weighted average of the actual alignment settings $A_i$ minus the corresponding modeled errors $D_i$ in control database 134, which are based on post-develop overlay metrology 126 of prior lots i<L. Feedback correction $C_L$ to the alignment settings of the current lot L is computed 36 as follows:

$$C_L = \sum_{i=1}^{L-1} w_i(A_i - D_i)$$

$$\sum_{i=1}^{L-1} w_i = 1$$

In general, C, A, and D are vectors representing the set of alignment terms applicable to a given lithography system.

However, a drawback to using post lithography data is that the measurements can be readily biased by previous processing of the wafers. It has been found that specific process layers are susceptible to process-induced shifts in the post-develop overlay measurements relative to the true overlay; e.g. chemical-mechanical polishing (CMP) smearing of overlay marks, asymmetric mark fill, asymmetric resist coating, and the like. This bias, which frequently fits the modeled parameters, is then fed back to the lithography tool on subsequent lots resulting in an alignment error. The error is self-fulfilling to lot disposition in that the resulting lot overlay measurements appear to be in specification. This error may go unnoticed until final wafer test where the result may be yield loss. Thus, it would be desirable to include the results of post-etch overlay metrology in the determination of the optimum post-alignment corrections C.

Measuring the overlay targets after the final image, or post etch processing, can result in more accurate measurements. Post lithography processing frequently removes the optical error bias. In this way, it would be better to disposition the lot and control the lithography process by measuring the lot overlay after the post lithography processing. As shown in FIG. 1, etch overlay feedback requires insertion of a post-etch overlay metrology step 130, after etching the developed pattern 128. However, this is not believed to be done in the industry for three reasons: 1) the lot cannot be reworked once it has gone through further processing; 2) the feedback response time for lot to lot control is greatly lengthened; and 3) since the lot must be measured post litho for the rework issue, post etch metrology adds to both wafer cost and requires extra tool capacity. This makes the post etch measurement generally too costly to implement in addition to the post lithography measurement.

SUMMARY OF THE INVENTION

Bearing in mind the problems and deficiencies of the prior art, it is therefore an object of the present invention to provide an improved method of determining positioning error and monitoring overlay quality of different layers of integrated circuit fields during lithographic processing of semiconductor wafers.

It is another object of the present invention to provide a lithographic alignment method that reduces alignment error due to bias resulting from process-induced shifts in the post-develop overlay measurements relative to the true overlay.

A further object of the invention is to provide a method of incorporating post-etch measurement feedback in determining lithographic overlay error without introducing additional costs or processing time.

Still other objects and advantages of the invention will in part be obvious and will in part be apparent from the specification.

The above and other objects, which will be apparent to those skilled in the art, are achieved in the present invention which is directed to a method of determining positioning error between lithographically produced integrated circuit patterns on at least two different lithographic levels of a semiconductor wafer comprising. The method includes exposing, developing and etching one or more lithographic levels to create one or more groups of marks comprising a target at one or more wafer locations. The method then includes exposing and developing a subsequent group of marks within the target on a subsequent lithographic level. The method then comprises measuring the position of the marks on each level with respect to a common reference point, and using the measured positions of the groups of marks to determine the relative positioning error between one or more pairs of the developed and etched lithographic levels on which the marks are located.

Preferably, the common reference point is the center of a radially symmetric arrangement of marks in the target, and the target marks are located at corners of a geometric shape.

The method may be used where the groups of marks on the lithographic levels are present in one processing lot of semiconductor wafers. The method may further include adjusting alignment of the lithographic levels on the processing lot of semiconductor wafers based on feedback of bias between etched and developed positioning error for a subsequent level of a prior lot of the semiconductor wafers. The positioning error for the subsequent level of a prior lot of the semiconductor wafers may be determined by using measured positions of groups of marks between one or more pairs of the developed and etched lithographic levels on the prior lot of the semiconductor wafers.

In a more preferred embodiment, the etched group of marks of each lithographic level comprise a plurality of sub-patterns symmetric about a center and at a same first distance therefrom, and the subsequent developed group of marks comprise a plurality of sub-patterns symmetric about a center and at a same second distance therefrom. The center of the subsequent developed group of marks is intended to be at the same location as the center of the etched group of marks. The second distance may be the same or different than the first distance. The sub-patterns of the subsequent developed group of marks are preferably substantially non-overlapping with the sub-patterns of the etched group of marks. Positioning error is then measured by determining the center of the etched group of marks and the center of the subsequent developed group of marks and comparing locations of the respective centers.

The sub-patterns may comprise elements symmetric about x- and y-axes. The method may further include determining the center of each sub-pattern, and using the center of the sub-patterns to determine the center of each of the groups of marks.

If the center of the etched group of marks is at the origin of an orthogonal grid of pitch p, the sub-patterns of the etched group of marks may have coordinates of:

$(-X,Y)p, (Y,X)p, (X,-Y)p$ and $(-Y,-X)p$, where X and Y are integers, and the distance r of each first target sub-pattern from the center of the etched group of marks is defined by the equation:

$r = p\sqrt{(X^2+Y^2)}$, and wherein the sub-patterns of the subsequent developed group of marks have coordinates of:

$(-X+x,Y+y)p, (Y+y,X+x)p, (X+x,-Y+y)p$ and $(-Y+y,-X+x)p$, where x and y are integers, and $|x|+|y|=2i$, where i is an integer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-5 of the drawings in which like numerals refer to like features of the invention.

The present invention provides an improved method to permit the post etch measurement to be used to reduce the post lithography bias in the metrology. The method employs prior photo level, post etch measurement targets, which are usually visible at subsequent post lithography metrology steps. This enables the measurements for the level of interest to be compared to the post lithography measurements, so that error bias may be determined between the two. It has also been shown that this bias remains fairly constant for a given tool/process conditions.

The modeled error bias may be used by the APC application to correct the lithography control by adding the modeled bias to the last set of post lithography measurements. Although the bias may drift over time or after tool maintenance, it will be automatically accounted for in a timely fashion in this closed loop method.

The method of the present invention employs a multi-level target or artifact that permits target sub-patterns or marks deposited on one level to be seen on at least one subsequent lithographic level. This is achieved by intentionally avoiding placement of target sub-patterns on one level directly over the nominal location of a target sub-pattern of the previous layer. The target system preferably employed in the present invention is the multi-layer target disclosed in U.S. patent application Ser. Nos. 11/162,506 and 11/833,304, the disclosures of which are hereby incorporated by reference. The target places a plurality of sub-patterns at a constant radial distance about a common center, such that the sub-patterns are symmetric about a target pattern center and preferably define the corners of a geometric shape, more preferably a square. Other geometric shapes may also be used, with the sub-patterns located at the corners of the shapes. The sub-patterns can be any feature or combination of features that is symmetric about the x-y axes, such as a cross, circle, square, square grid, and the like. The cross is the simplest among the sub-pattern options.

Figure 1:
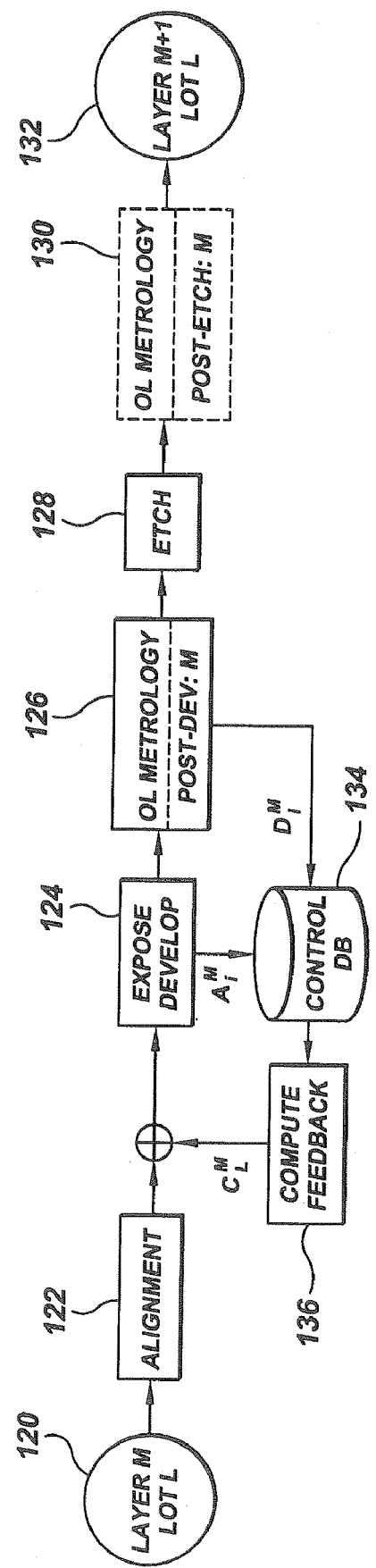
FIG. 1 is a flow chart showing prior art methods of monitoring overlay quality in lithographic processing.
Figure 2:
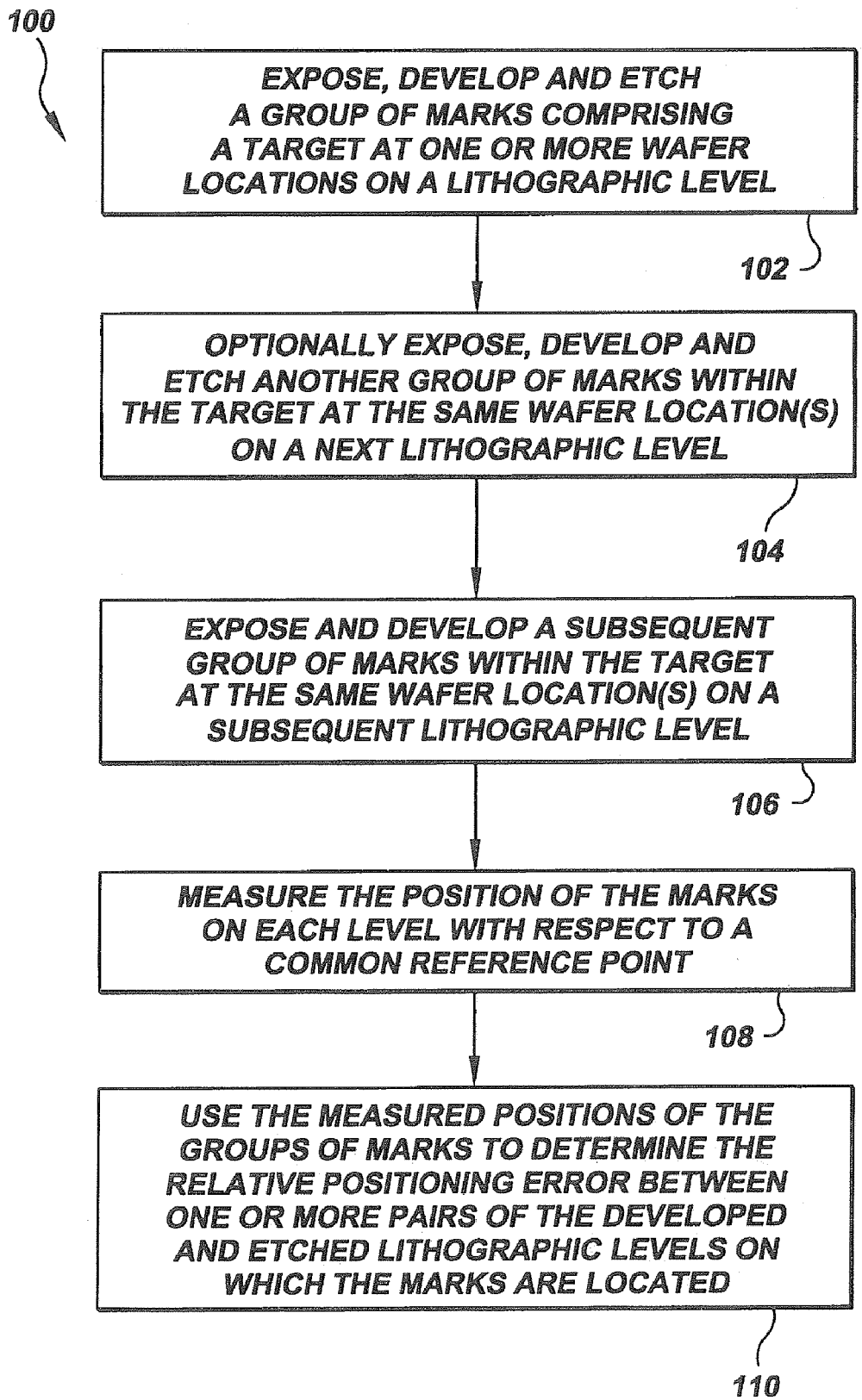
FIG. 2 is a flow chart illustrating the method of determining positioning error and monitoring overlay quality in lithographic processing in accordance with the present invention.

FIG. 2 shows the instant method 100 of determining positioning error between lithographically produced integrated circuit patterns on at least two different lithographic levels of a semiconductor wafer. A group of marks comprising a target is first exposed, developed and etched at one or more wafer locations on a lithographic level, 102. Optionally, another group of marks is exposed, developed and etched at the same wafer location(s) on a next lithographic level, 104. (Step 104 may be further repeated.) On a subsequent lithographic level, a subsequent group of marks is exposed and developed within the target, 106. For each level, the position of the marks is then measured with respect to a common reference point, 108. Then, the measured positions of the groups of marks are used to determine, the relative positioning error between one or more pairs of the developed and etched lithographic levels on which the marks are located, 110.

Figure 3:
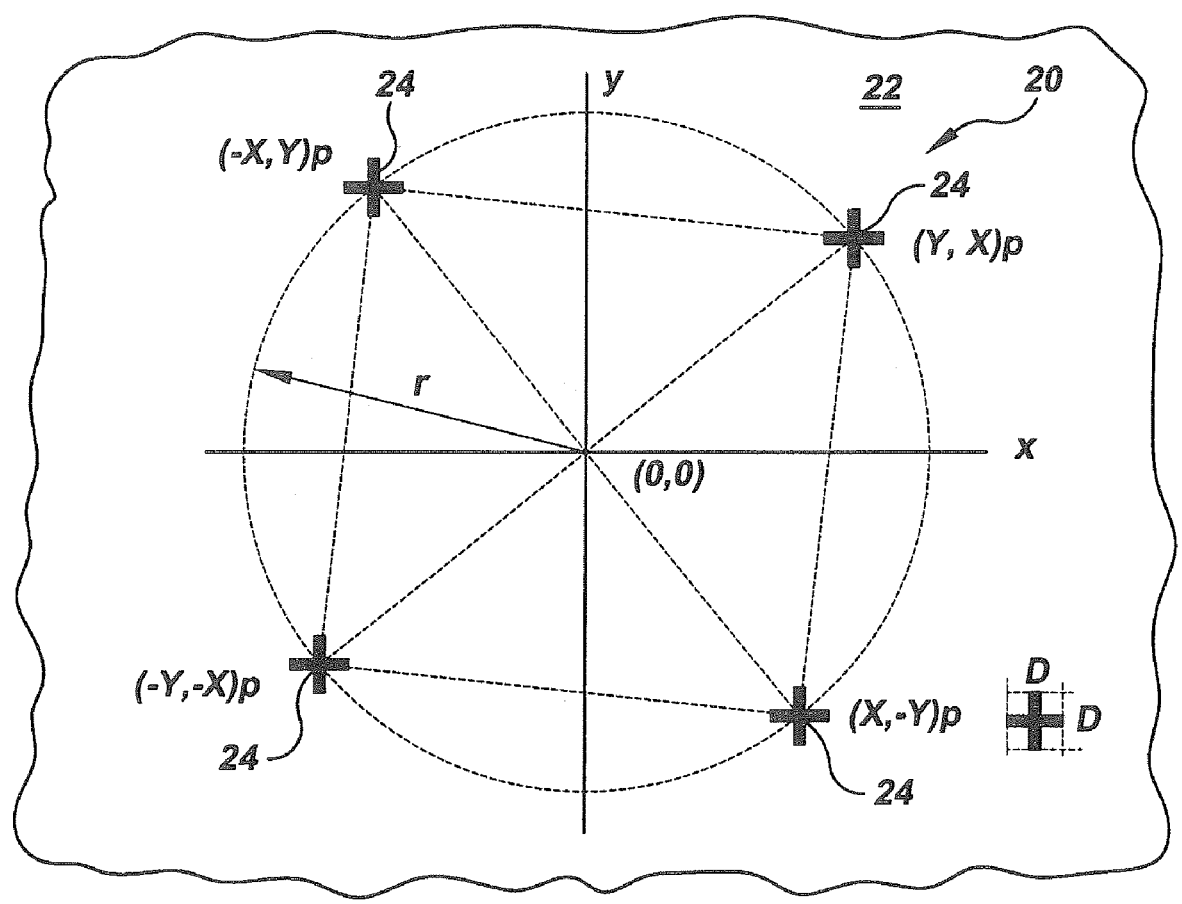
FIG. 3 is a top plan view of the layout of one embodiment of sub-patterns in a preferred target pattern on a single lithographic layer.

As shown in FIG. 3, one embodiment of a target pattern or mark group 20 in accordance with the present invention is shown on a single lithographic layer 22 on a wafer. In an actual wafer production, lithographic level 22 contains an integrated circuit field (not shown), and target pattern 20 is located in an inactive area of the wafer either within the chip boundary or in the kerf region. Target pattern or mark group 20 forms a square superimposed over a regular orthogonal grid of pitch p. Sub-patterns 24 comprise crosses located at the corners of the square whose center is at the origin of the x- and y-axes. The length of the line segments making up the sub-pattern crosses is shown as dimension D. The x-y location of each sub-pattern from the center (0, 0) of the square are integer multiples (X, Y) of p. The centers of the sub-patterns are located at a distance, radius r, from the center of the target pattern:

$$r = p\sqrt{(X^2 + Y^2)},$$

As the targets are created on each of the different lithographic layers containing the other portions of the integrated circuit, the (X, Y) values are incremented by integers (x, y). Each layer corresponds to unique values of (X, Y). Radial symmetry of the target is maintained at each layer. The radii of the sub-patterns may be the same or different for each lithographic layer and the centers of the sub-patterns of each target on each layer define a unique radius for the target on a layer. Under the constraint that the sum of the absolute values of the increments are even, i.e, |x|+|y|=2i for integer i, superposition of the sub-patterns over multiple layers defines an overlay target in the form of a close-packed checkerboard array.

Figure 4:
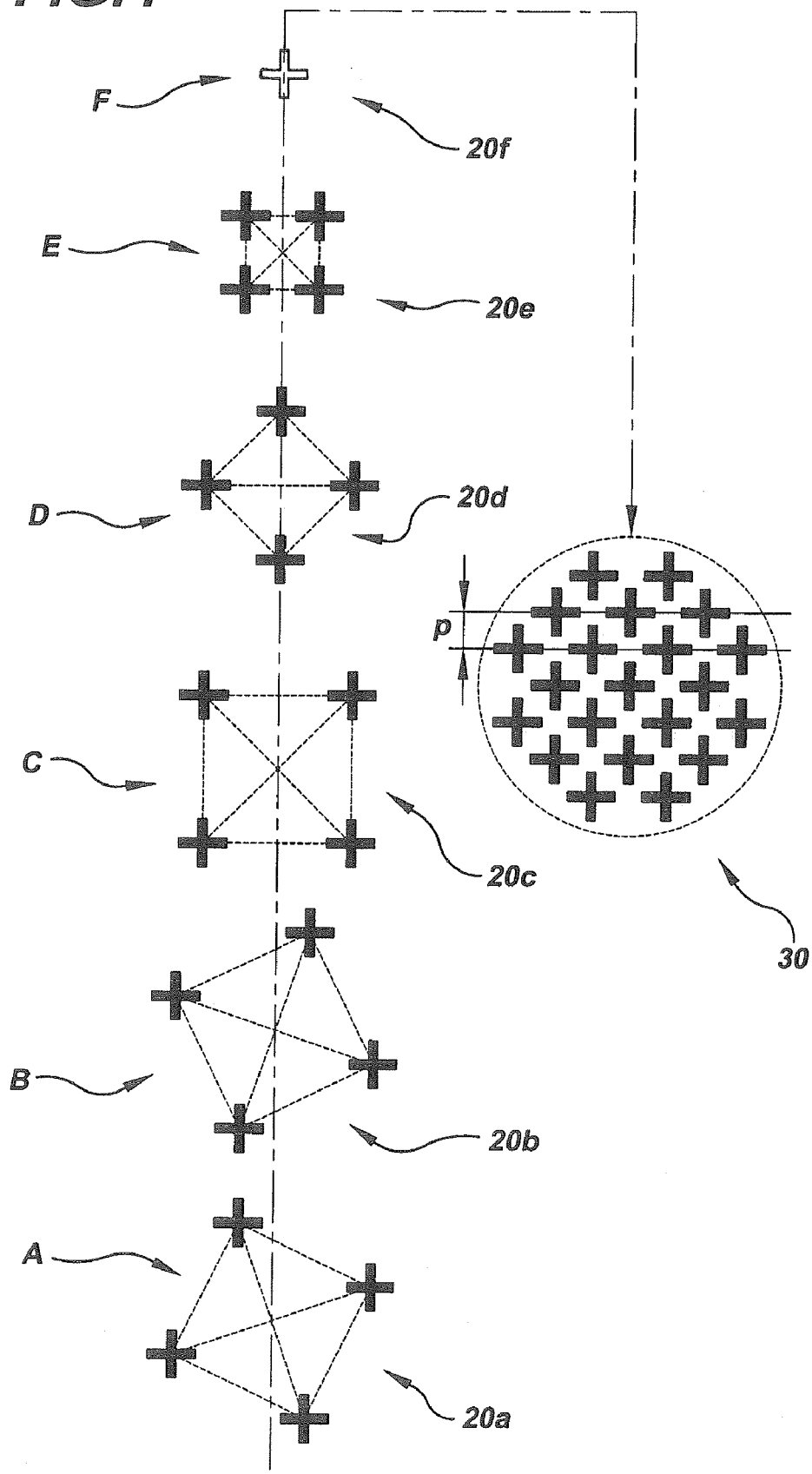
FIG. 4 is a top plan view of the layout of target patterns of the type shown in FIG. 2 in successive lithographic layers A through F.

As shown in FIG. 4, target patterns 20a, 20b, 20c, 20d, 20e and 20f are formed on lithographic layers A, B, C, D, E and F, respectively. The targets of layers A through E are formed in a square pattern as described above; the target of layer F is a single sub-pattern cross at the center of the overlaid array of targets. The individual targets 20a, 20b, 20c, 20d, 20e and 20f are located on their respective layers so that they would all have the same center location if the layers were perfectly aligned. Instead of being located on different layers, some of the targets may be overlaid or "stitched" together from different patterns in different fields lithographically formed on the same layer. Each of the target patterns 20a, 20b, 20c, 20d, and 20e is incremented from the one preceding it in the manner described above. After the successive lithographic layers are formed over one another, the target patterns or mark groups may be viewed overlaid on one another as shown by combined target pattern array 30. The cross sub-patterns do not overlap in the array provided the cross dimension D<2p.

Due to the symmetry of the sub-pattern arrangement, the center of the target (0, 0) shown in FIG. 3 is a common reference point for all layers represented in the target. The preferred measurement method consists of determining the (x, y) center of each printed sub-pattern, such as the cross mark 24 shown in FIG. 3, and using those sub-pattern centers to locate each "layer-center", defined as the average of the sub-pattern centers at each layer. Overlay errors among the different lithographic layers represented in the target are then determined by taking pair-wise differences between the layer-center locations in x and y.

Figure 5:
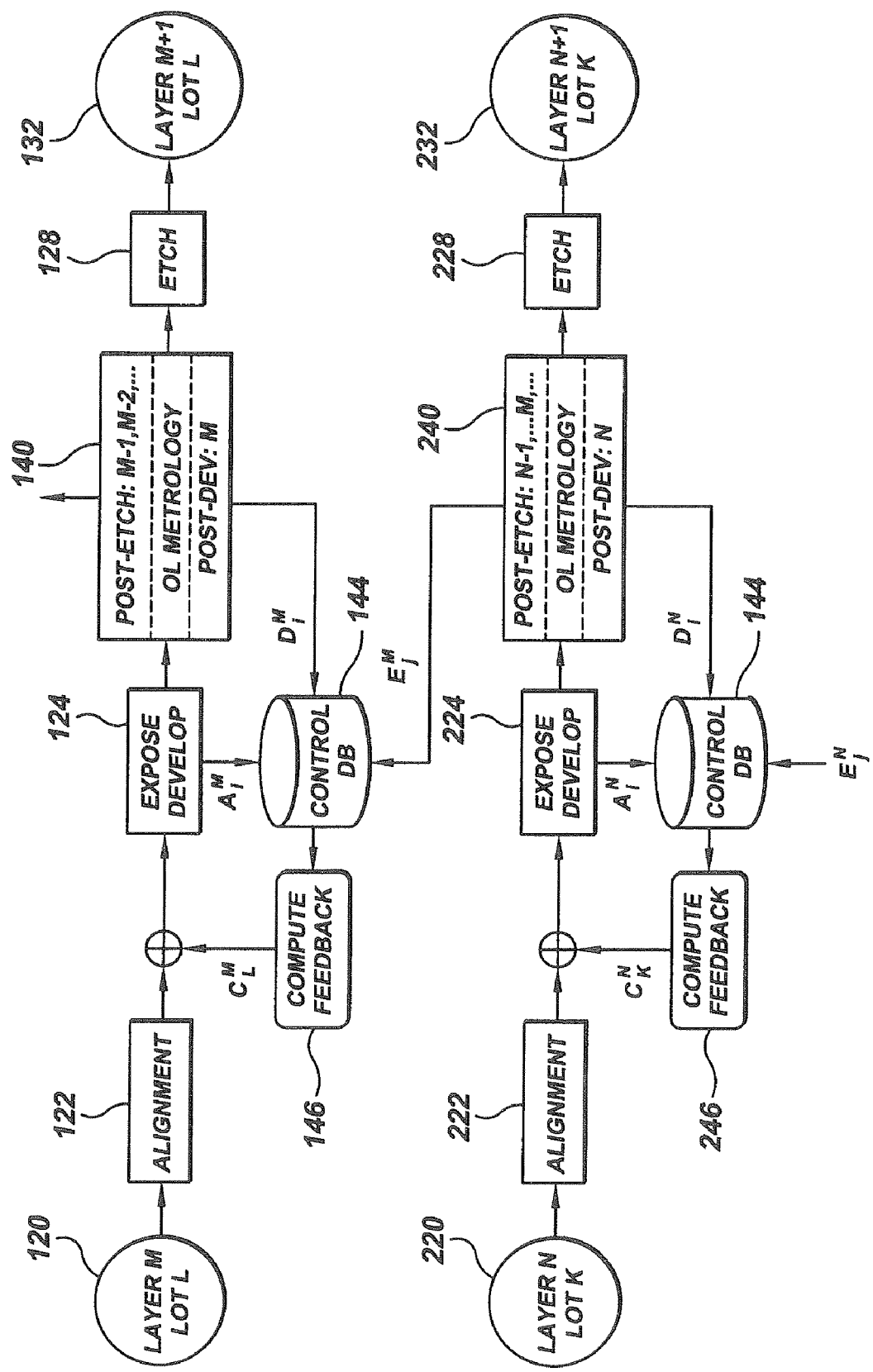
FIG. 5 is a flow chart showing the more preferred methods of determining positioning error and monitoring overlay quality in lithographic processing in accordance with the present invention.

The method of the present invention integrates post-etch overlay metrology with no significant increase in metrology tool capacity or cycle time. As illustrated in FIG. 5, layer M of the current wafer lot L is deposited 120 over the previously etched and completed lithographic process layer M−1. At this $M^{th}$ process level, the mask and projected image are aligned 122 over the layer to be etched. The image of the $M^{th}$ layer is then exposed and developed 124 on a resist layer over layer M, and the exposure and development alignment settings $A_i^M$ are stored in control database 144. The developed image is subsequently etched 128, and the next layer M+1 of Lot L is then processed 132 in a similar manner.

Unlike the prior art, the method includes after exposure and developing 124 the simultaneous measurement 140 of the location of the developed target pattern or mark group overlay on the current lithographic layer M, along with the overlay location of the etched target pattern or mark group of the prior layer M−1. Because of the target system employed in the present invention, the marks of current layer at develop and the marks of prior etched layers are visible in the target system at the same time. Overlay of etched target patterns or mark groups of even earlier layers M−2 and the like may also be measured, to the extent that the earlier layers are visible. The post-etch overlay location measurement and comparison of current layer post-develop and prior layer post etch targets is enabled by use of the target system described above in connection with FIGS. 3 and 4.

To monitor overlay quality and feed back corrections to the alignment settings of the current lot L, overlay data must be parsed by the current (post-develop) target and prior (post-etch) target layers for each lithographic layer. Subsequently, the overlay data, i.e., relative locations, of the current layer post-develop target (layer M) and prior layer post-etch target (layer M−1) are then stored in control database 144 and used in APC feedback analysis 146 to provide feedback correction to adjust the alignment settings of subsequent lots. The feedback correction $C_L^M$ for the current lot L is derived from the measurements of prior lots stored in database 144.

Post-etch measurements of the current layer M are performed at the post-develop overlay metrology step of future layers M+1, M+2, and on. No explicit post-etch overlay metrology step is required to obtain post-etch overlay measurements, so there is negligible added cost and significant added value to the measurements.

The method of the present invention preferably also uses for level M feedback the data stored in database 144 from post-etch metrology E performed on a subsequent level N, where N>M, from a prior lot K, where K<L. Processing of Layer N of Lot K 220 proceeds in a manner similar to that for Layer M, Lot L. The mask and projected image are aligned 222 and the image of the $N^{th}$ layer is then exposed and developed 224 on a resist layer over layer N, and the exposure and development alignment settings $A_i^N$ are stored in control database 144. The developed image is subsequently etched 228, and the next layer N+1 of Lot K is then processed 132 in a similar manner. Separate post-etch metrology steps are not required.

Feedback at each layer is computed as follows:

$$C_L = \sum_{i=1}^{L-1} w_i(A_i - D_i) - B_L$$

$$B_L = \sum_{j=1}^{K-1} w_j(E_j - D_j)$$

$$\sum_{i=1}^{L-1} w_i = \sum_{j=1}^{K-1} w_j = 1$$

The bias B between post-etch E and post-develop D overlay errors is determined based on the prior lots K<L that have been measured at the subsequent level(s) N>M. Over multiple lots, the feedback corrections C rely primarily on the more accurately determined post-etch E errors. However, the inclusion of post-develop D errors remain important in cases where rapid feedback is required, such as single lot rework, and new and low-volume products. The control method of the present invention is therefore able to achieve optimum performance over a much wider range of operating conditions than does the prior art.

Thus, the present invention provides an improved method of determining positioning error and monitoring overlay quality of different layers of integrated circuit fields during lithographic processing of semiconductor wafers. The inventive method reduces alignment error due to bias resulting from process-induced shifts in the post-develop overlay measurements relative to the true overlay. The method of the present invention overcomes the concerns set forth in the background section: 1) the lot is still measured at the post lithography metrology step and so can be reworked; 2) the feedback response time is held short because the control is still done just after the lot was exposed; and 3) no added metrology time or added measurement step is needed since the post etch measurement is done at the time of the next post lithography step. Using the targets described above and in FIGS. 3 and 4, both sets of measurements can be made in one measurement step, which results in no added processing time (or cost) on the metrology tool.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of determining positioning error between lithographically produced integrated circuit patterns on at least two different lithographic levels of a semiconductor wafer comprising:
   exposing, developing and etching one or more lithographic levels to create one or more groups of marks comprising a target at one or more wafer locations;
   exposing and developing a subsequent group of marks within the target on a subsequent lithographic level;
   measuring the position of the marks on each level with respect to a common reference point; and
   using the measured positions of the groups of marks to determine the relative positioning error between one or more pairs of the developed and etched lithographic levels on which the marks are located.

2. The method of claim 1 wherein the common reference point is the center of a radially symmetric arrangement of marks in the target.

3. The method of claim 1 wherein the groups of marks on the lithographic levels are present in one processing lot of semiconductor wafers, and including adjusting alignment of the lithographic levels on the processing lot of semiconductor wafers based on feedback of bias between etched and developed positioning error for a subsequent level of a prior lot of the semiconductor wafers.

4. The method of claim 3 wherein positioning error for the subsequent level of a prior lot of the semiconductor wafers was determined by using measured positions of groups of marks between one or more pairs of the developed and etched lithographic levels on the prior lot of the semiconductor wafers.

5. The method of claim 1 wherein the etched group of marks of each lithographic level comprise a plurality of sub-patterns symmetric about a center and at a same first distance therefrom, and wherein the subsequent developed group of marks comprise a plurality of sub-patterns symmetric about a center and at a same second distance therefrom, the center of the subsequent developed group of marks intended to be at the same location as the center of the etched group of marks, the second distance being the same or different than the first distance and the sub-patterns of the subsequent developed group of marks being substantially non-overlapping with the sub-patterns of the etched group of marks, and wherein positioning error is measured by determining the center of the etched group of marks and the center of the subsequent developed group of marks and comparing locations of the respective centers.

6. The method of claim 5 wherein the sub-patterns comprise elements symmetric about x- and y-axes.

7. The method of claim 6 further including determining the center of each sub-pattern, and using the center of the sub-patterns to determine the center of each of the groups of marks.

8. The method of claim 5 wherein, if the center of the etched group of marks is at the origin of an orthogonal grid of pitch p, the sub-patterns of the etched group of marks have coordinates of:

$(-X,Y)p, (Y,X)p, (X,-Y)p$ and $(-Y,-X)p$, where X and Y are integers, and the distance r of each first target sub-pattern from the center of the etched group of marks is defined by the equation:

$r = p\sqrt{(X^2+Y^2)}$, and wherein the sub-patterns of the subsequent developed group of marks have coordinates of:

$(-X+x,Y+y)p, (Y+y,X+x)p, (X+x,-Y+y)p$ and $(-Y+y,-X+x)p$, where x and y are integers, and $|x|+|y|=2i$, where i is an integer.

9. The method of claim 5 wherein the target sub-patterns are located at corners of a geometric shape.

10. A method of determining positioning error between lithographically produced integrated circuit patterns on at least two different lithographic levels of a semiconductor wafer comprising:
- exposing, developing and etching one or more lithographic levels to create one or more groups of marks comprising a target at one or more wafer locations, each of the groups having a radially symmetric arrangement of the marks and being located in an inactive area of the wafer;
- exposing and developing a subsequent group of marks within the target on a subsequent lithographic level, each of the subsequent groups having a radially symmetric arrangement of the marks;
- measuring the position of the marks on each level with respect to a common reference point, the common reference point comprising the center of each radially symmetric arrangement of marks; and
- using the measured positions of the groups of marks to determine the relative positioning error between one or more pairs of the developed and etched lithographic levels on which the marks are located.

11. The method of claim 10 wherein the groups of marks on the lithographic levels are present in one processing lot of semiconductor wafers, and including adjusting alignment of the lithographic levels on the processing lot of semiconductor wafers based on feedback of bias between etched and developed positioning error for a subsequent level of a prior lot of the semiconductor wafers.

12. The method of claim 11 wherein positioning error for the subsequent level of a prior lot of the semiconductor wafers was determined by using measured positions of groups of marks between one or more pairs of the developed and etched lithographic levels on the prior lot of the semiconductor wafers.

13. The method of claim 10 wherein the etched group of marks of each lithographic level comprise a plurality of sub-patterns symmetric about a center and at a same first distance therefrom, and wherein the subsequent developed group of marks comprise a plurality of sub-patterns symmetric about a center and at a same second distance therefrom, the center of the subsequent developed group of marks intended to be at the same location as the center of the etched group of marks, the second distance being the same or different than the first distance and the sub-patterns of the subsequent developed group of marks being substantially non-overlapping with the sub-patterns of the etched group of marks, and wherein positioning error is measured by determining the center of the etched group of marks and the center of the subsequent developed group of marks and comparing locations of the respective centers.

14. The method of claim 13 wherein the sub-patterns comprise elements symmetric about x- and y-axes.

15. The method of claim 14 further including determining the center of each sub-pattern, and using the center of the sub-patterns to determine the center of each of the groups of marks.

16. The method of claim 13 wherein, if the center of the etched group of marks is at the origin of an orthogonal grid of pitch p, the sub-patterns of the etched group of marks have coordinates of:

$$(-X,Y)p, (Y,X)p, (X,-Y)p \text{ and } (-Y,-X)p,$$

where X and Y are integers, and the distance r of each first target sub-pattern from the center of the etched group of marks is defined by the equation:

$$r = p\sqrt{(X^2+Y^2)},$$

and wherein the sub-patterns of the subsequent developed group of marks have coordinates of:

$$(-X+x,Y+y)p, (Y+y,X+x)p, (X+x,-Y+y)p \text{ and } (-Y+y,-X+x)p,$$

where x and y are integers, and $$|x|+|y|=2i,$$

where i is an integer.

17. The method of claim 13 wherein the target sub-patterns are located at corners of a geometric shape.

18. A method of determining positioning error between lithographically produced integrated circuit patterns on at least two different lithographic levels of a semiconductor wafer comprising:
- exposing, developing and etching one or more lithographic levels to create one or more groups of marks comprising a target at one or more wafer locations, each of the groups comprising an arrangement of a plurality of sub-patterns radially symmetric about a center and at a same first distance therefrom;
- exposing and developing a subsequent group of marks within the target on a subsequent lithographic level, each of the subsequent groups comprising an arrangement of a plurality of sub-patterns radially symmetric about a center and at a same second distance therefrom, the center of the subsequent developed group of marks intended to be at the same location as the center of the etched group of marks, the second distance being the same or different than the first distance and the sub-patterns of the subsequent developed group of marks being substantially non-overlapping with the sub-patterns of the etched group of marks;
- measuring the position of the marks on each level with respect to a common reference point, the common reference point comprising the center of each radially symmetric arrangement of marks; and
- determining the center of the etched group of marks and the center of the subsequent developed group of marks and comparing locations of the respective centers to determine the relative positioning error between one or more pairs of the developed and etched lithographic levels on which the marks are located.

19. The method of claim 18 wherein the groups of marks on the lithographic levels are present in one processing lot of semiconductor wafers, and including adjusting alignment of the lithographic levels on the processing lot of semiconductor wafers based on feedback of bias between etched and developed positioning error for a subsequent level of a prior lot of the semiconductor wafers.

20. The method of claim 19 wherein positioning error for the subsequent level of a prior lot of the semiconductor wafers was determined by using measured positions of groups of marks between one or more pairs of the developed and etched lithographic levels on the prior lot of the semiconductor wafers.

* * * * *